United States Patent
Ohkubo et al.

(10) Patent No.: US 7,064,696 B2
(45) Date of Patent: Jun. 20, 2006

(54) CURRENT DRIVE CIRCUIT, LIGHT EMITTING ELEMENT DRIVE CIRCUIT AND DIGITAL-ANALOG CONVERTER

(75) Inventors: Manabu Ohkubo, Otsu (JP); Masayuki Ozasa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/019,944

(22) Filed: Dec. 23, 2004

(65) Prior Publication Data

US 2005/0174099 A1   Aug. 11, 2005

(30) Foreign Application Priority Data

Dec. 24, 2003   (JP)  ............... 2003-426841

(51) Int. Cl.
*H03M 1/00*   (2006.01)
(52) U.S. Cl. ............... 341/136; 341/135; 341/144; 323/312; 323/315; 323/316
(58) Field of Classification Search ......... 341/135–136
See application file for complete search history.

(56) References Cited

U.S. PATENT DOCUMENTS 6,646,580 B1 *  11/2003  Clara et al. ............... 341/136
2004/0195981 A1   10/2004  Mizuno et al.

FOREIGN PATENT DOCUMENTS

JP            11251912        9/1999
JP            2003188465      7/2003

* cited by examiner

*Primary Examiner*—Rexford Barnie
*Assistant Examiner*—Khai M. Nguyen
(74) *Attorney, Agent, or Firm*—Stevens, Davis, Miller & Mosher, LLP

(57) ABSTRACT

A first current mirror circuit that operates at the time of a rise in a first signal is connected to a current source, a second current mirror circuit that operates at the time of a rise in the first signal is connected to the first current mirror circuit, and a third current mirror circuit that operates at the time of a rise in a second signal is respectively connected to the current source and the point of connection between the first current mirror circuit and the second current mirror circuit. A pulse generation circuit for generating first and second signals from an external signal is provided. The second signal rises in sync with the first signal, and falls before the first signal.

12 Claims, 12 Drawing Sheets

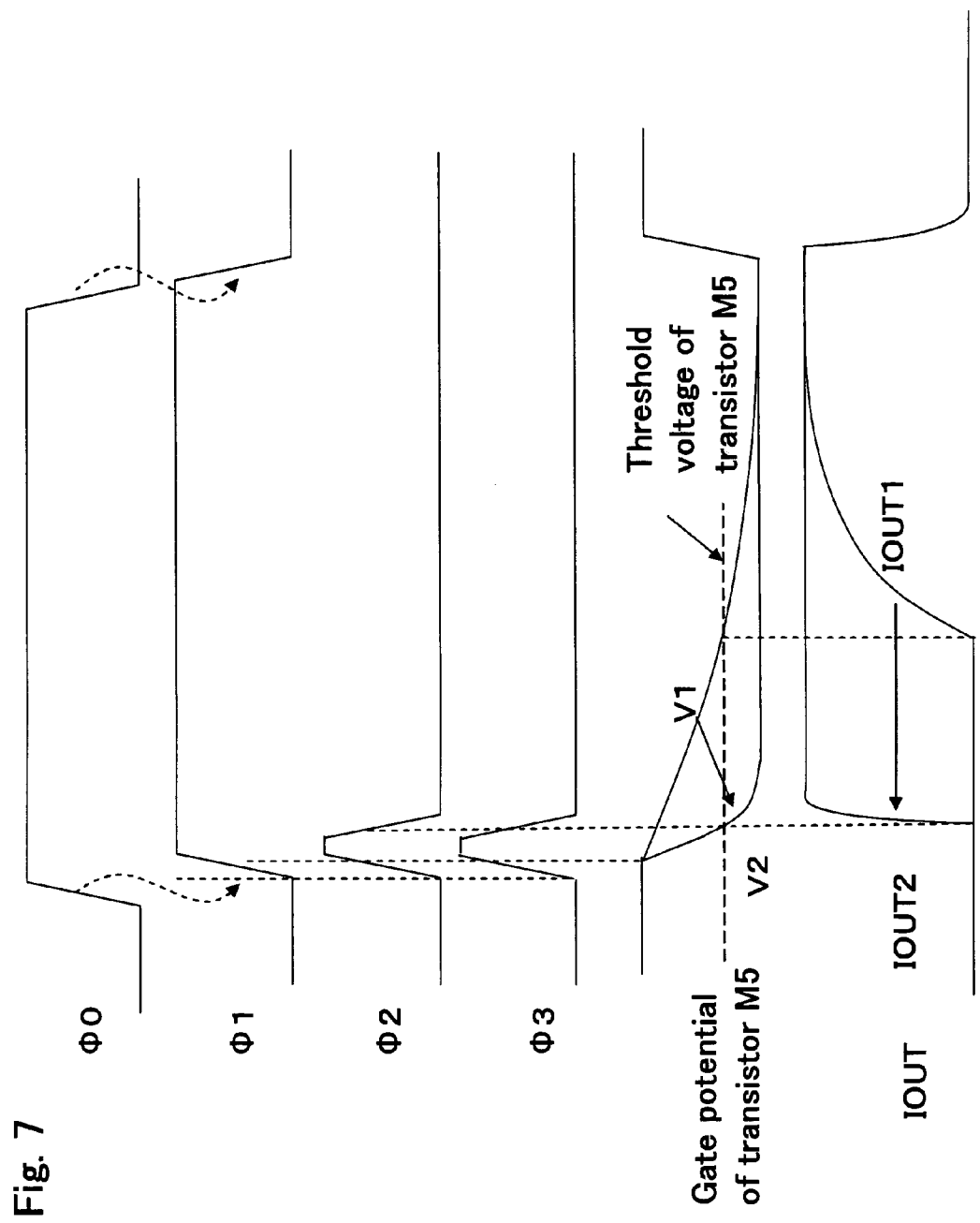

CURRENT DRIVE CIRCUIT, LIGHT EMITTING ELEMENT DRIVE CIRCUIT AND DIGITAL-ANALOG CONVERTER

BACKGROUND OF THE INVENTION

1. Field of the Invention

The present invention relates to a current drive circuit where the output current, for example, is adjustable and the load is current-driven in pulse form in accordance with an external signal.

There is a light emitting element drive circuit for current driving a light emitting element such as, for example, a laser diode in pulse form as a current drive circuit. In addition, there is a digital-analog converter, as another example of a current drive circuit. This digital-analog converter has a configuration where a current value that corresponds to the weight of each bit of two-value data made of one or more bits is outputted from a current outputting part provided for each bit, an output current for each bit is turned on and off in accordance with the value of two-value data, and output currents for respective bits are added, synthesized and outputted.

2. Prior Art

In recent years, light emitting elements such as laser diodes have been current-driven in pulse form so that information is written into a memory medium such as an optical disk. It is necessary to increase the speed of the drive pulse of a light emitting element in order to increase the speed of such write-in of information.

A conventional light emitting element drive circuit for current-driving a light emitting element, such as a laser diode, is disclosed in, for example, Patent Document 1.

FIG. 11 is a circuit diagram showing a light emitting element drive circuit according to the prior art (Patent Document 1). In FIG. 11, symbol VREF indicates a reference voltage source. Symbols M14 and M15 indicate MOS transistors that form a current mirror-type current output circuit. Symbol M11 indicates a MOS transistor that forms a circuit for generating reference current IREF in accordance with reference voltage source VREF. Symbol PG indicates a pulse generation circuit. Symbol SW11 indicates a switch which turns on and off by receiving an output signal from pulse generation circuit PG. Symbol OS indicates a one-shot circuit which starts up by receiving an output signal from pulse generation circuit PG. Symbols M12 and M13 indicate circuits for improving a rise in the output current by receiving an output from one-shot circuit OS.

In this light emitting element drive circuit, switch SW11 is turned on when a current is outputted. Then, reference current IREF that has been generated by MOS transistor M11 and reference voltage source VREF is connected to the current mirror-type current output circuit that is formed of MOS transistors M14 and M15. Furthermore, the rise in the output current is improved by MOS transistors M12 and M13, as well as one-shot circuit OS.

When the current is turned off, switch SW11 is turned off. As a result of this, the gate potential of MOS transistor M15 is adjusted to a voltage which is lower than power supply voltage VDD by the threshold voltage of MOS transistor M14, by using MOS transistor M14.

In addition, a digital-analog converter is disclosed in, for example, Patent Document 2.

FIG. 12 is a circuit diagram showing a digital-analog converter according to the prior art (Patent Document 2). In FIG. 12, symbol IREF indicates a reference current source. Symbols M21 and M22 indicate MOS transistors that form a current mirror circuit for mirroring the current of reference source IREF. Symbols M24 and M25 indicate MOS transistors that form a current mirror-type current output circuit. Symbol SW21 indicates a switch for turning off MOS transistor M25.

In this digital-analog converter, switch SW21 is turned off at the time when a current is outputted. On the other hand, when the current is cut off, switch SW21 is turned on and MOS transistor M25 is turned off.

Patent Document 1: Japanese Unexamined Patent Publication 2003-188465 (page 11, FIG. 6)

Patent Document 2: Japanese Unexamined Patent Publication H11 (1999)-251912 (page 1, FIG. 1) Recording has conventionally been carried out on a recording medium such as an optical disk by using a light emitting element such as a laser diode. In recent years, high-speed recording in this recording medium which may be an optical disk has been required due to demand in the market. As a result of this requirement, it has become necessary to current-drive a light emitting element such as a laser diode at a high speed.

However, there has been a problem so far in the operation with high-speed rise and fall in the case where a light emitting element such as a laser diode is current-driven.

In addition, it has conventionally been necessary to optimize the amount of light emitted from the laser diode by means of adjustment of the amount of drive current to the light emitting element, in order to carry out optimal recording on a recording medium such as an optical disk. That is to say, the drive current to the light emitting element which may be a laser diode is not constant, but rather, is adjusted to the optimal value. Therefore, it has been necessary to drive a light emitting element drive circuit with the optimal amount of current in accordance with respective factors, such as the type of recording medium, the recording method and the properties of the light emitting element. Thus, there has been a problem so far in achieving high-speed rise and fall while maintaining the linearity of the output current.

In the case of a circuit such as that disclosed in FIG. 11, for example, first, switch SW11 is turned on when a current is outputted. Then, reference current IREF that has been generated by MOS transistor M11 and reference voltage source VREF is connected to the current mirror-type output circuit, which is formed of MOS transistors M14 and M15. In addition, the rise in the output current is improved by MOS transistors M12 and M13, as well as one-shot circuit OS.

When the output current is turned off, however, first, switch SW11 is turned off. Then, the gate potential of MOS transistor M15 is increased by using only MOS transistor M14 where a diode connection is made, and thereby, MOS transistor M15 is turned off. Accordingly, a high-speed fall cannot be expected.

In addition, the gate potential of MOS transistor M15 is provided by using MOS transistor M14 where a diode connection is made. Therefore, a voltage that is lower than power supply voltage VDD by the threshold voltage of MOS transistor M14 is provided. Accordingly, MOS transistor M15 is not completely turned off. As a result, a leak current flows.

In addition, in the case of a circuit such as that disclosed in FIG. 12, switch SW21 is turned on when the current is cut off. In this circuit, MOS transistor M25 is turned off by turning on switch SW21, and therefore, a high-speed fall can be achieved. However, MOS transistor M22 continues to be in the state of operation, and therefore, the gate potential of MOS transistor M25 does not become completely equal to power supply voltage VDD. Therefore, MOS transistor M25 cannot be completely turned off, and a leak current flows.

In addition, when a current is outputted, the current mirror circuit, which is a current output circuit and is formed of MOS transistors M24 and M25, is driven only by the current mirror circuit that is formed of MOS transistors M21 and M22. Here, a current drive circuit is driven by reference current source IREF. Accordingly, when the value of reference current IREF is small, relative to the input load capacitance of the current drive circuit, a high-speed rise in the output current cannot be expected.

SUMMARY OF THE INVENTION

The present invention is provided in order to solve the above described problem with the prior art, and an object thereof is to provide a current drive circuit that can achieve a high-speed rise.

A current drive circuit according to the first invention is provided with a current source for generating and outputting a current, a current output circuit into which a current is inputted and which outputs an amplified current, and an output current control circuit.

The above described current output circuit raises an output current in accordance with an external signal. In addition, the output current control circuit temporarily supplies a current that has a value corresponding to the output current value of the current source to the current output circuit at the time when the output current of the current output circuit is raised, and thereby, makes the rise in the output current of the current output circuit steep.

In this configuration, a current is temporarily supplied from the output current control circuit to the current output circuit in response to the rise in the output current of the current output circuit. The value of the current is a value that corresponds to the value of the reference current. Therefore, the input load capacitance of the current output circuit is discharged (or charged) at a high speed, and the rise in the output current of the current output circuit can be made steep. As a result of this, a high-speed rise in the output current can be achieved while maintaining the linearity of the output current of the current output circuit.

In the current drive circuit of the above described invention, the current output circuit is formed of a first current mirror circuit of which the current input part is connected to, for example, a current source, and a second current mirror circuit of which the current input part is connected to the current output part of the first current mirror circuit. In this configuration, a current that has a value corresponding to the current value of the current source is supplied to the second current mirror circuit.

In this configuration a current is temporarily supplied from the output current control circuit to the second current mirror circuit, in response to the rise in the output current of the current output circuit, that is to say, the output current of the second current mirror circuit. The value of the current is a value that corresponds to the value of the reference current. Therefore, the input load capacitance of the second current mirror circuit is discharged (or charged) at a high speed, and the rise in the output current of the second current mirror circuit can be made steep. As a result of this, a high-speed rise in the output current can be achieved while maintaining the linearity of the output current of the second current mirror circuit.

In addition, it is preferable for the current drive circuit of the above described invention to be further provided with a first switching element that is respectively connected to the current output part of the first current mirror circuit and a first power supply voltage, and a second switching element that is respectively connected to the current input part of the second current mirror circuit and a second power supply voltage. Here, the first and second switching elements switch and operate in opposite phases, in accordance with an external signal, where the first switching element raises the output current of the first current mirror circuit when turned on, and the second switching element raises the output current of the second current mirror circuit when turned off.

In this configuration, a high-speed fall in the output current can be achieved.

In addition, it is preferable for the current drive circuit of the above described invention to have the following configuration. That is to say, a pulse generation circuit for generating first and second signals from an external signal is further provided. In addition, the first and second current mirror circuits operate at the time when the first signal rises. In addition, the output current control circuit is formed of a third current mirror circuit. The third current mirror circuit, where the current input part and the current output part are respectively connected to the current source and the point of connection between the first current mirror circuit and the second current mirror circuit, operates at the time when the second signal rises. The second signal rises in sync with the first signal, and falls before the first signal.

In this configuration, a current is temporarily supplied from the third current mirror circuit to the second current mirror circuit in response to a rise in the output current of the second current mirror circuit. The value of the current is a value that corresponds to the value of the reference current. Therefore, the input load capacitance of the second current mirror circuit is discharged (or charged) at a high speed, and the rise in the output current of the second current mirror circuit can be made steep. As a result of this, a high-speed rise in the output current can be achieved while maintaining the linearity of the output current of the second current mirror circuit.

It is preferable for the current drive circuit of the above describe electronic device invention to have the following configuration. That is to say, a third signal is further generated from an external signal. A current injection element is further provided, of which both ends are respectively connected to the point of connection between the first current mirror circuit and the second current mirror circuit and the power supply voltage, and which injects a current to the current input part of the second current mirror circuit at the time when the third signal rises. The third signal rises in sync with the first signal, and falls before the first signal.

In this configuration, the output current can be prevented from overshooting and undershooting.

It is preferable for the configuration that has the above described current injection element to be further provided with a first switching element which is respectively connected to the current output part of the first current mirror circuit and a first power supply voltage, a second switching element which is respectively connected to the current input part of the second current mirror circuit and a second power supply voltage, a third switching element which is respectively connected to the current output part of the third current mirror circuit and the first power supply voltage, and a fourth switching element which is respectively connected to the current injection element and either of the first and second power supply voltages.

Here, the first and second switching elements switch and operate in opposite phases in accordance with the first signal, the third switching element switches and operates in accordance with the second signal, and the fourth switching element switches and operates in accordance with the third signal. In addition, the first switching element raises the output current of the first current mirror circuit when turned on. In addition, the second switching element raises the output current of the second current mirror circuit when turned off. In addition, the third switching element raises the output current of the third current mirror circuit when turned on. In addition, the fourth switching element raises the output current of the current injection element.

In the above described configuration, it is the light emitting element drive circuit that supplies the output current of the current output circuit to a light emitting element.

In addition, the current source is made to have a configuration where an analog current of which the value corresponds to the weight of a bit of two-value digital data is generated and outputted, and thereby, a digital-analog converter can be formed by using the current drive circuit.

In the following, a concrete means for solving the problem according to the present invention is described.

A reference current source for setting the reference current is connected to one end of a first current mirror circuit having two parallel lines. The other end of the first current mirror circuit is connected to a second current mirror circuit. A current source is connected to the drain and the gate of a first MOS transistor that forms this first current mirror circuit. A third MOS transistor for the switch that is utilized when the first output current is turned off is connected to the source of a second MOS transistor.

One end of the second current mirror circuit having two parallel lines is connected to a light emitting element. The other end of the second current mirror circuit is connected to the first current mirror circuit. The first current mirror circuit is connected to the drain and the gate of a fourth MOS transistor that forms this second current mirror circuit. In addition, a sixth MOS transistor for the switch that is utilized when the output current is turned off is connected between the gate of a fifth MOS transistor that is connected to the light emitting element and the power supply. That is to say, the reference current is generated by the current source, and a current that is equal to or proportional to the reference current is outputted from the first and second current mirror circuits. At this time, the reference current is monitored by the output current control circuit so as to control the second current mirror circuit. As a result of this, high-speed rise and fall can be achieved while maintaining the linearity of the output current.

One of the methods for implementing the output current control circuit is as follows. The line to which the current source of the first current mirror circuit is connected is connected to the gate of a seventh MOS transistor. In addition, a third current mirror circuit is formed, through which a boost current that is equal to or proportional to the reference current flows. The third current mirror circuit is formed so as to operate only at the time of a rise when a current is outputted, by using an eight MOS transistor for a switch.

In addition, it is necessary to convert the second current mirror circuit from the off state to the on state at a high speed in order to achieve a high-speed rise. At this time, it is necessary to maintain the linearity of the output current, by suppressing overshooting and undershooting of the output current. In order to do so, it is necessary to gain at a high speed the threshold voltage that converts the fourth MOS transistor and the fifth MOS transistor of the second current mirror circuit to the on state. Thus, a ninth MOS transistor and a tenth MOS transistor for injecting a current are utilized. The gate of the ninth MOS transistor is provided a bias voltage in accordance with the input load capacitance of the second current mirror circuit. The tenth MOS transistor is utilized as a switch and turned on only at the time of a rise in the output current. As a result of this, the second current mirror circuit is converted from the off state to the on state at a high speed, and thus, a high-speed rise in the output current is achieved.

The present invention can provide a current drive circuit that achieves a high-speed rise while maintaining the linearity of the output current.

BRIEF DESCRIPTION OF THE DRAWINGS

FIG. 7 is a diagram illustrating the operation of a current drive circuit according to the third embodiment of the present invention;

DESCRIPTION OF THE PREFERRED EMBODIMENTS

First Embodiment

Figure 1:
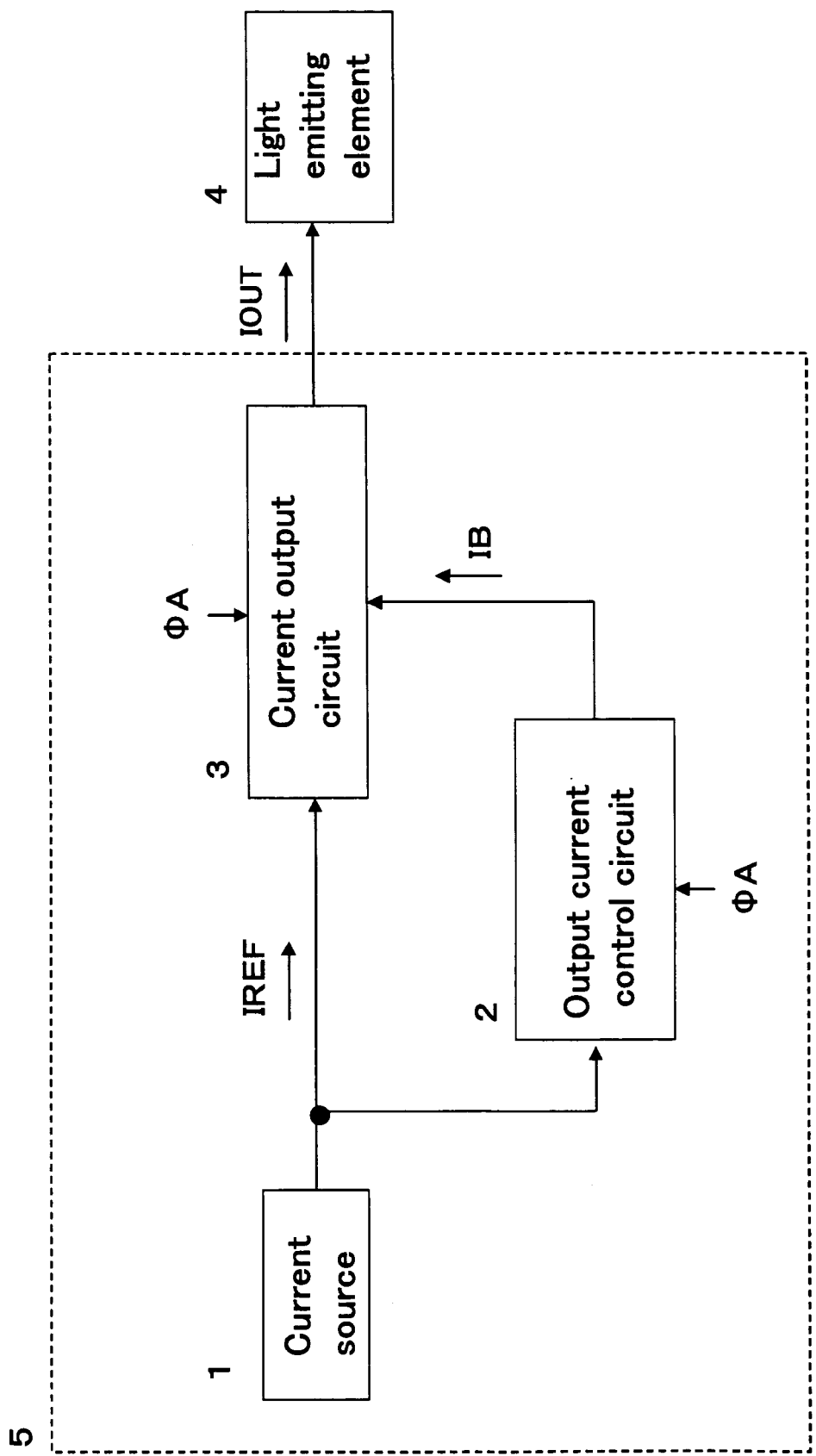
FIG. 1 is a circuit diagram showing a current drive circuit according to the first embodiment of the present invention.

FIG. 1 shows the basic configuration of a current drive circuit according to the first embodiment of the present invention. In FIG. 1, a current drive circuit 5 according to the present embodiment is formed of a current source 1 for generating and outputting reference current IREF that becomes the reference for output current IOUT, an output current control circuit 2 for controlling the amount of a boost current to the amount that corresponds to the output current, and a current output circuit 3 for outputting a current to a light emitting element 4. Current control circuit 2 is respectively connected to current source 1 and current output circuit 3. Current output circuit 3 raises or lowers output current IOUT in accordance with input signal Φ4A, which is an external signal. In addition, output current control circuit 2 temporarily supplies current IB that has a value corresponding to the value of reference current IREF of current source 1 to current output circuit 3 at the time when output current IOUT of current output circuit 3 is raised. As a result of this, a rise in output current IOUT of current output circuit 3 is made steep.

The same input signal ΦA is inputted into both output current control circuit 2 and current output circuit 3 as an external signal. Thus, this current output circuit 3 and output current control circuit 2 operate in sync with input signal ΦA. Concretely speaking, input signal ΦA is a rectangular wave signal and current output circuit 3, for example, raises output current IOUT in response to a rise in input signal (A, and lowers output current IOUT in response to a fall in input signal ΦA. In addition, output current control circuit 2 temporarily outputs current (boost current) IB in response to a rise in input signal ΦA, and supplies the current to current output circuit 3. This boost current IB has a value that corresponds to the value of reference current IREF of current source 1.

In this current drive circuit 5, reference current IREF is generated in current source 1. Here, this reference current IREF is a direct current. Current output circuit 3 outputs in rectangular wave form current IOUT, which is equal to or proportional to this reference current IREF, that is to say, which is gained by amplifying this reference current IREF, to light emitting element 4. At this time, output current control circuit 2 monitors reference current IREF of current source 1, so as to control current output circuit 3.

Concretely speaking, output current control circuit 2 achieves a high-speed rise in output current IOUT while maintaining the linearity of current IOUT that is outputted from current output circuit 3. Therefore, output current control circuit 2 outputs boost current IB to current output circuit 3. As described above, this boost current IB is temporarily supplied to current output circuit 3 at the time when output current IOUT of current output circuit 3 rises. The value of the current is a value that is proportional to the current value of reference current IREF. As a result of this, the input load capacitance of current output circuit 3 is discharged (or charged) at a high speed. This boost current IB is supplied to current output circuit 3, and thereby, a rise in output current IOUT of current output circuit 3 is made steep.

According to this embodiment, current IB is temporarily supplied from output current control circuit 2 to current output circuit 3 in response to a rise in output current IOUT of current output circuit 3, where the value of the current is a value that corresponds to the value of the reference current. Therefore, the input load capacitance of current output circuit 3 is discharged (or charged) at a high speed, and thereby, a rise in output current IOUT of current output circuit 3 can be made steep. As a result of this, a high-speed rise in output current IOUT can be achieved while maintaining the linearity of output current IOUT of current output circuit 3.

Second Embodiment

Figure 2:
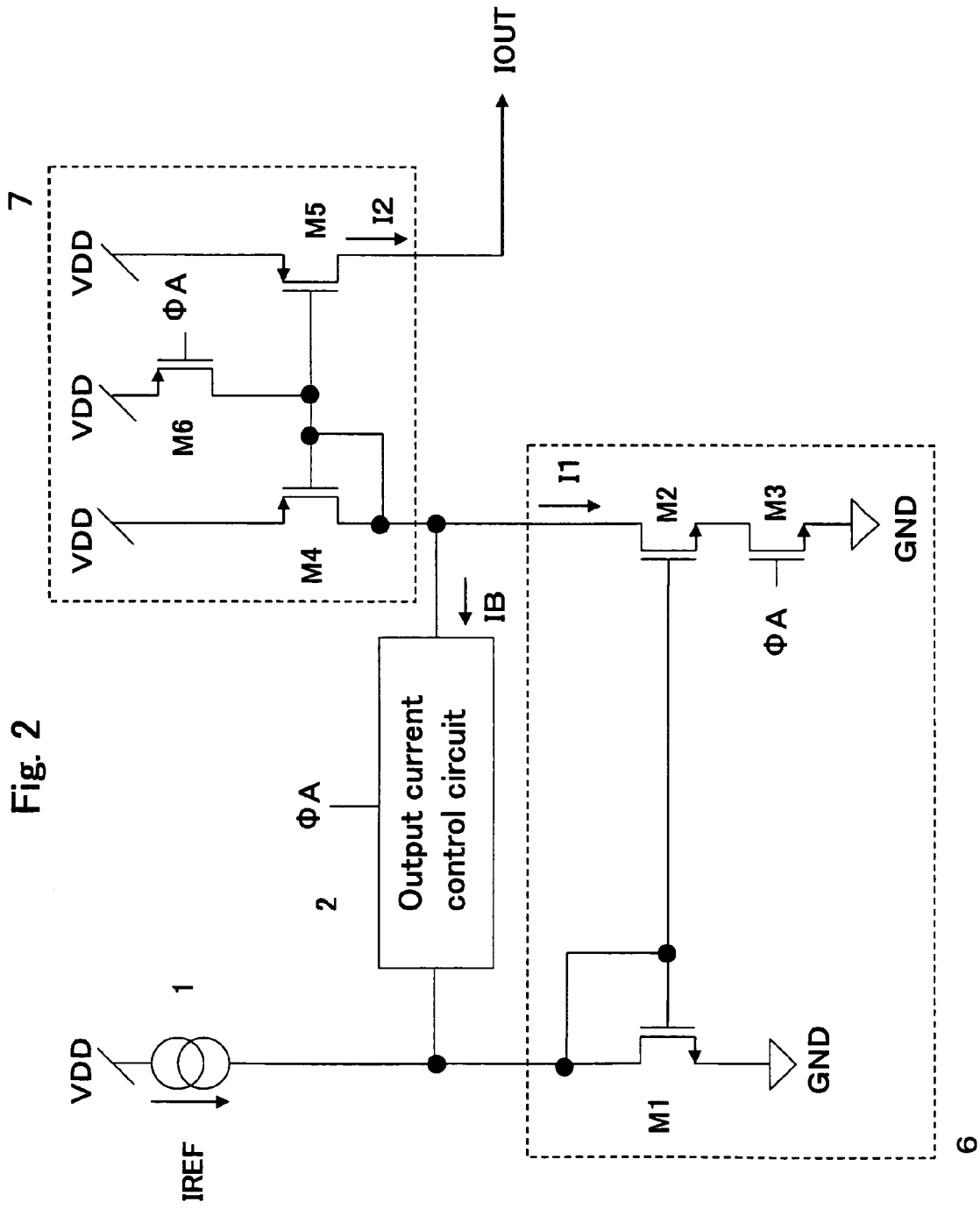
FIG. 2 is a circuit diagram showing a current drive circuit according to the second embodiment of the present invention.

FIG. 2 shows the basic configuration of a current drive circuit according to the second embodiment of the present invention. Here, the same symbols are attached to parts that are the same as those of FIG. 1. In FIG. 2, this current drive circuit is formed of a current source 1, a first current mirror circuit 6 into which reference current IREF is inputted from current source 1, and which outputs a first output current I1 that is gained by amplifying this reference current IREF, a second current mirror circuit 7 into which first output current I1 is inputted, and which outputs a second output current I2 that is gained by amplifying this first output current I1, and an output current control circuit 2 for monitoring reference current IREF from current source 1 and for controlling the amount of boost current in sync with input signal ΦA.

In first current mirror circuit 6, the current input part is connected to current source 1. In addition, in second current mirror circuit 7, the current input part is connected to the current output part of first current mirror circuit 6. Output current control circuit 2 is respectively connected to current source 1 and to the point of connection between first current mirror circuit 6 and second current mirror circuit 7.

First current mirror circuit 6 and second current mirror circuit 7 raise output current IOUT in accordance with input signal 101 A, which is an external signal, and lower output current IOUT. Output current control circuit 2 temporarily supplies a current having a value that corresponds to the value of reference current IREF of current source 1 to second current mirror circuit 7 at the time when output current IOUT is raised by first current mirror circuit 6 and second current mirror circuit 7. As a result of this, the rise in output current IOUT from second current mirror circuit 7 is made steep.

Concretely speaking, output current control circuit 2 achieves a high-speed rise in output current IOUT while maintaining the linearity of current IOUT that is outputted from second current mirror circuit 7. In order to do so, output current control circuit 2 outputs boost current IB to second current mirror circuit 7. As described above, this boost current IB is temporarily supplied to second current mirror circuit 7 at the time of a rise in output current IOUT from second current mirror circuit 7. The value of the current is a value that is proportional to the current value of reference current IREF. As a result of this, the input load capacitance of second current mirror circuit 7 is discharged (or charged) at a high speed. This boost current IB is supplied to second current mirror circuit 7, and thereby, the rise in output current IOUT from second current mirror circuit 7 is made steep.

Here, current output circuit 3 of FIG. 1 is formed of first current mirror circuit 6 and second current mirror circuit 7. First current mirror circuit 6 is formed of NMOS transistors M1 and M2. Second current mirror circuit 7 is formed of PMOS transistors M4 and M5.

Furthermore, in the current drive circuit according to the present embodiment, first current mirror circuit 6 has NMOS transistor M3 for a switch that is utilized when first output current I1 of first current mirror circuit 6 is turned off. In addition, second current mirror circuit 7 has PMOS transistor M6 for a switch that is utilized when second output current I2 of second current mirror circuit 7 is turned off. NMOS transistor M3 is respectively connected to the current output part of first current mirror circuit 6 and to the first power supply voltage (GND). In addition, PMOS transistor M6 is respectively connected to the current input part of second current mirror circuit 7 and to the second power supply voltage (VDD). Thus, NMOS transistor M3 and PMOS transistor M6 switch and operate in opposite phases, in accordance with input signal ΦA, which is an external signal. At this time, NMOS transistor M3 raises output current I1 of first current mirror circuit 6 when turned on. In addition, PMOS transistor M6 raises output current I2 of second current mirror circuit 7 when turned off. Output current control circuit 2 temporarily supplies current IB having a value that corresponds to the value of reference current IREF of current source 1 to second current mirror circuit 7 when NMOS transistor M3 is turned on. As a result of this, the rise in output current IOUT from second current mirror circuit 7 is made steep.

The above described configuration has the effect of achieving high-speed rise and fall while maintaining the linearity of output current IOUT (second output current).

Figure 3:
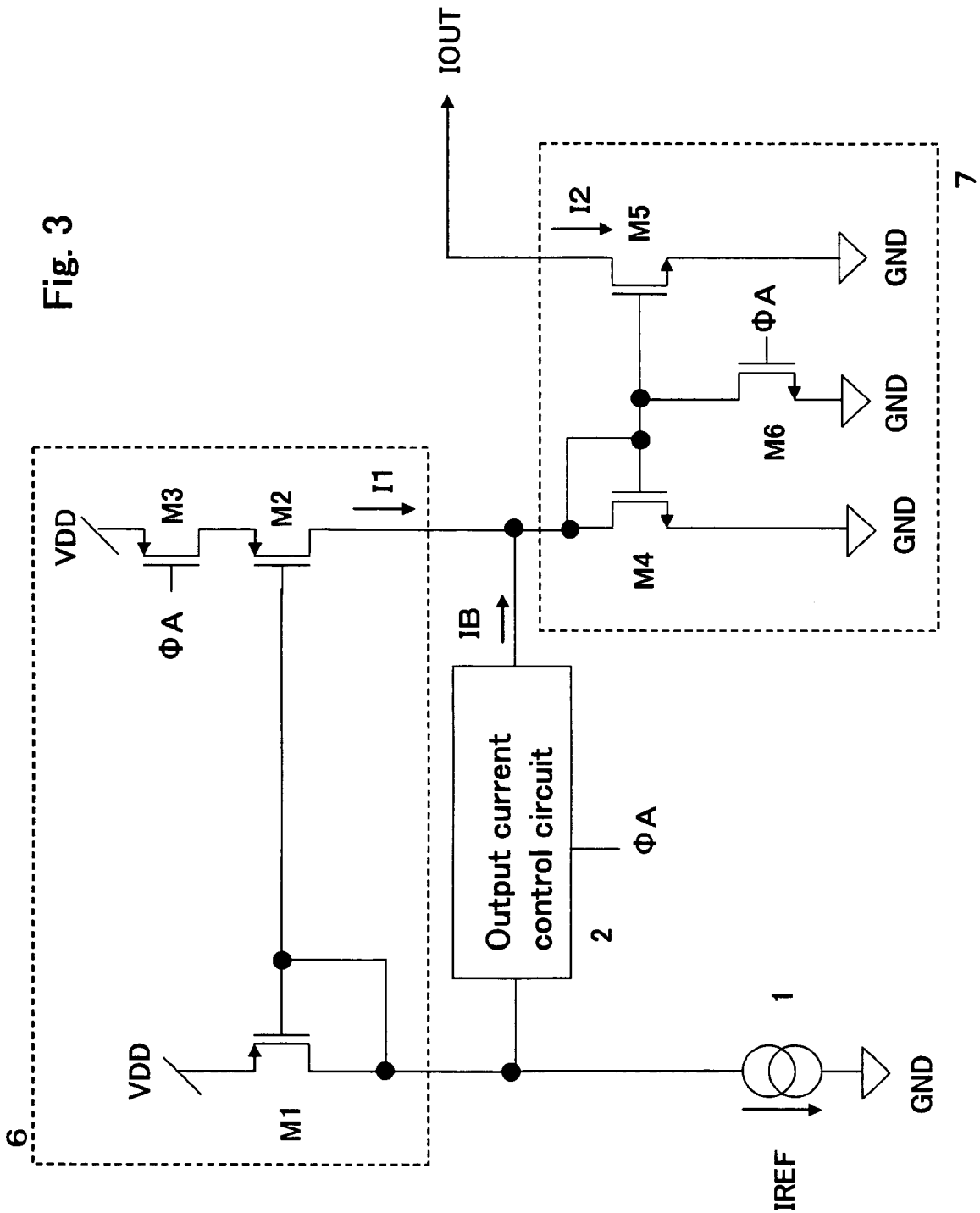
FIG. 3 is a circuit diagram showing a current drive circuit according to the second embodiment of the present invention.

FIG. 3 shows a configuration where the above described first current mirror circuit 6 of FIG. 2 is formed of PMOS transistors M1 and M2, and second current mirror circuit 7 is formed of NMOS transistors M4 and M5. In addition, MOS transistor M3 of first current mirror circuit 6 is formed of a PMOS transistor, and MOS transistor M6 of second current mirror circuit 7 is formed of an NMOS transistor. The circuit of FIG. 3 can gain the same effects as those of the circuit of FIG. 2.

Figure 4:
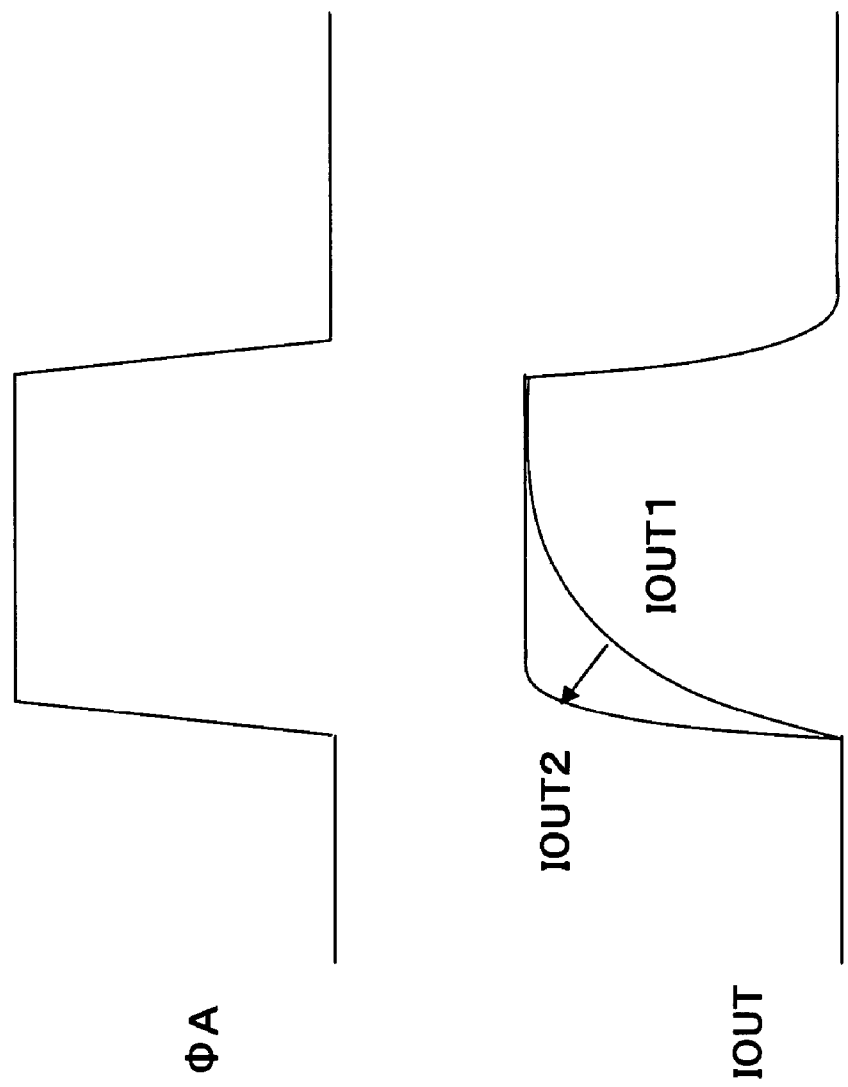
FIG. 4 is a diagram illustrating the operation of a current drive circuit according to the second embodiment of the present invention.

Next, the operation of the current drive circuit shown in FIG. 2 is described in reference to FIG. 4. FIG. 4 shows the operation of the current drive circuit of FIG. 2. Input signal ΦA, which is an external signal, is an input signal that switches at a high speed between two voltage levels, first power supply voltage GND and second power supply voltage VDD. First, when input signal ΦA transitions from the VDD potential to the GND potential, NMOS transistor M3 is turned off and PMOS transistor M6 is turned on. At this time, PMOS transistor M6 is turned on, and thereby, the gate of PMOS transistor M5 is charged to the VDD potential at a high speed.

On the other hand, NMOS transistor M3 is turned off, and thereby, NMOS transistor M2 does not operate. As a result of this, the gate potential of PMOS transistor M5 can be set completely at the power supply voltage. Consequently, PMOS transistor M5 is turned off at a high speed. PMOS transistor M5 is turned off at a high speed, and thereby, second output current I2 from second current mirror circuit 7 falls at a high speed.

Next, when input signal ΦA transitions from the GND potential to the VDD potential, PMOS transistor M6 is turned off and NMOS transistor M3 is turned on. Thus, second current mirror circuit 7 is driven by first output current I1 from first current mirror circuit 6. Here, the case may be that this first output current I1 is small in comparison with the input load capacitance of second current mirror circuit 7. In such a case, second current mirror circuit 7 cannot raise second output current I2 at a high speed (see "IOUT1" of FIG. 4).

However, output current control circuit 2 is provided so as to supply boost current IB to second current mirror circuit 7, in the configuration, and therefore, second current mirror circuit 7 can raise second output current I2 at a high speed. That is to say, output current control circuit 2 monitors reference current IREF. Thus, in the above described case, boost current IB is injected into the gate of PMOS transistor M5 in sync with the rise in input signal ΦA. As a result of this, the input load capacitance of second current mirror circuit 7 is discharged (or charged) at a high speed. Consequently, a high-speed rise in second output current I2 can be gained (see "IOUT2" of FIG. 4).

In this embodiment, current IB is temporarily supplied from output current control circuit 2 to second current mirror circuit 7 in response to the rise in output current I2 of second current mirror circuit 7, and the value of the current is a value that corresponds to the value of the reference current. Therefore, the input load capacitance of second current mirror circuit 7 is discharged (or charged) at a high speed, and the fall in output current IOUT from second current mirror circuit 7 can be made steep. Consequently, a high-speed rise in output current IOUT can be achieved while maintaining the linearity of output current IOUT from second current mirror circuit 7.

Third Embodiment

Figure 5:
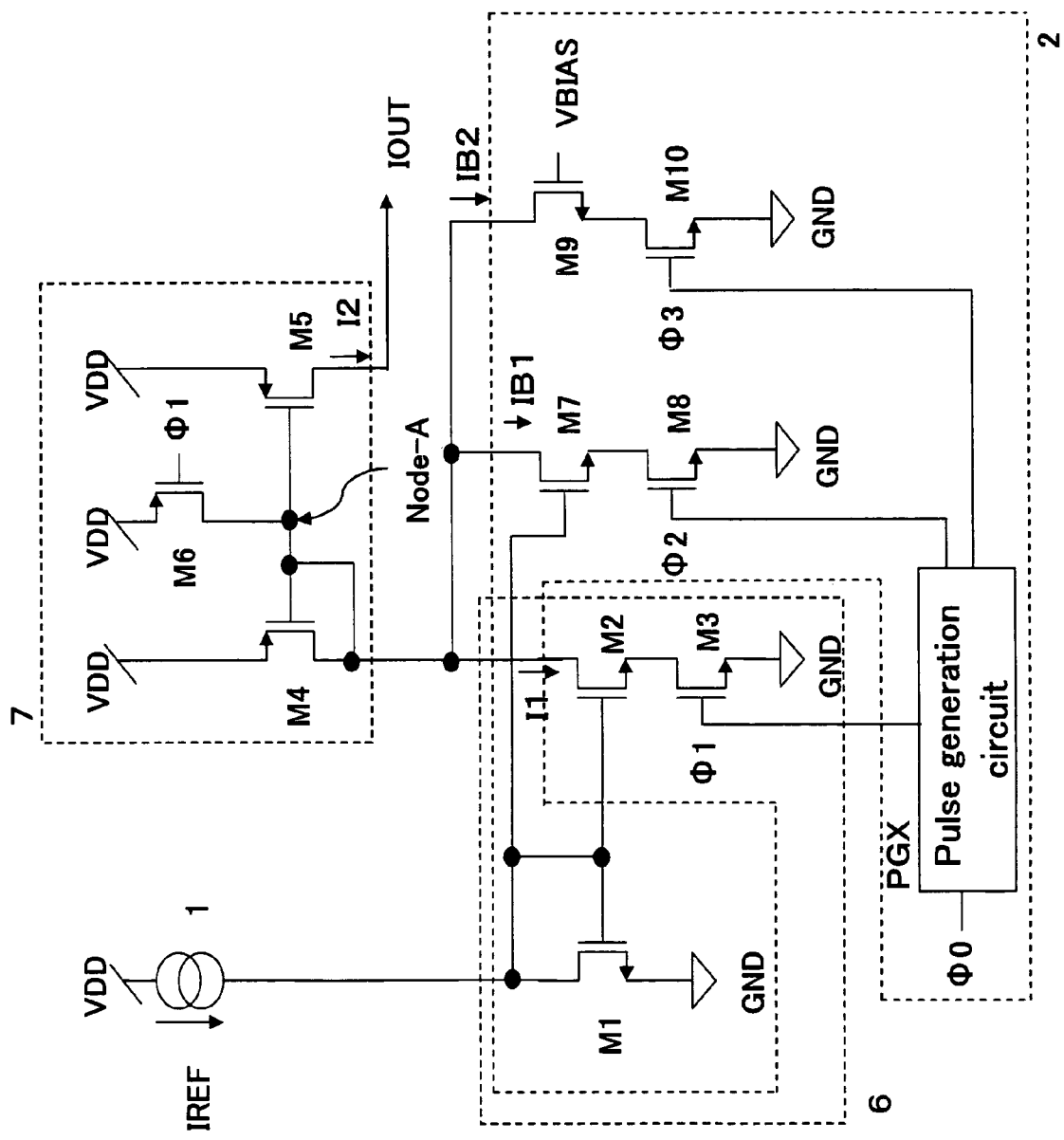
FIG. 5 is a circuit diagram showing a current drive circuit according to the third embodiment of the present invention.

FIG. 5 shows the basic configuration of a current drive circuit according to the third embodiment of the present invention. Here, the same symbols are attached to parts that are the same as those of FIGS. 1 to 3. In FIG. 5, the current drive circuit is formed of a current source 1, a first current mirror circuit 6 into which reference current IREF is inputted from current source 1, and which outputs a first output current I1 that is gained by amplifying this reference current IREF, a second current mirror circuit 7 into which first output current I1 of first current mirror circuit 6 is inputted, and which outputs a second output current I2 that is gained by amplifying first output current I1, and an output current control circuit 2 for monitoring reference current IREF from current source 1 and for controlling the amount of boost current.

First current mirror circuit 6, where the current input part is connected to current source 1, operates at the time of a rise or a fall in first signal Φ1. Second current mirror circuit 7, where the current input part is connected to the current output part of first current mirror circuit 6, operates at the time of a rise or a fall in first signal Φ1.

Output current control circuit 2 is provided with a third current mirror circuit where the current input part and current output part are respectively connected to current source 1 and the point of connection between first current mirror circuit 6 and second current mirror circuit 7, and which operates at the time of a rise in second signal Φ2, an NMOS transistor M9 which is a current injection element of which the two ends are respectively connected to the point of connection between first current mirror circuit 6 and second current mirror circuit 7, and to power supply voltage GND, and which injects a current into the current input part of second current mirror circuit 7 at the time of a rise in third signal Φ3, and a pulse generation circuit PGX for generating first, second and third signals Φ1, Φ2 and Φ3 from input signal Φ0, which is an external signal.

The above described second and third signals are signals that are in accordance with the same timing in this example, and rise in sync with first signal Φ1 and fall before first signal Here, output current control circuit 2 of the current drive circuit according to the present embodiment is concretely described. Output current control circuit 2 is particularly provided with an NMOS transistor M7 that forms a third current mirror circuit, together with NMOS transistor M1 of first current mirror circuit 6, and an NMOS transistor M8 that is utilized when boost current IB1 is turned off. Reference current IREF is inputted into this third current mirror circuit, which generates boost current IB by amplifying this reference current IREF. Thus, this boost current IB1 is outputted to second current mirror circuit 7.

Furthermore, output current control circuit 2 of the present embodiment is provided with an NMOS transistor M9, where a bias voltage VBIAS that is in accordance with the input load capacitance of second current mirror circuit 7 is inputted into the gate, and an NMOS transistor M10 for a switch that is utilized when boost current IB2 is turned off. This NMOS transistor M9 allows for the injection of boost current IB2 having an appropriate value, that is, a value in accordance with the amount of input load capacitance of second current mirror circuit 7. Therefore, overshooting and undershooting of the second output current can be suppressed. As a result of this, high-speed rise and fall can be achieved while maintaining the linearity of the second output current.

Here, MOS transistor M3 is respectively connected to the current output part of first current mirror circuit 6 and the first power supply voltage (GND). In addition, MOS transistor M6 is respectively connected to the current input part of second current mirror circuit 6 and the second power supply voltage (VDD). In addition, MOS transistor M8 is respectively connected to the current output part of the third current mirror circuit and the first power supply voltage (GND). In addition, MOS transistor M10 is respectively connected to MOS transistor M9, which is a current injection element, and the first power supply voltage (GND).

MOS transistors M3 and M6 switch and operate in accordance with first signal Φ1, and MOS transistors M8 and M10 respectively switch and operate in accordance with second and third signals Φ2 and Φ3.

In addition, in the present embodiment, output current control circuit 2 is provided with pulse generation circuit PGX for generating a number of output signals Φ1, Φ2 and Φ3 from input signal Φ0. This pulse generation circuit PGX outputs signals Φ1, Φ2 and Φ3 to the gates of MOS transistors M3, M6, M8 and M10. Each of MOS transistors M3, M6, M8 and M10 performs a switching function on the basis of these signals Φ1, Φ2 and Φ3.

Figure 8A:
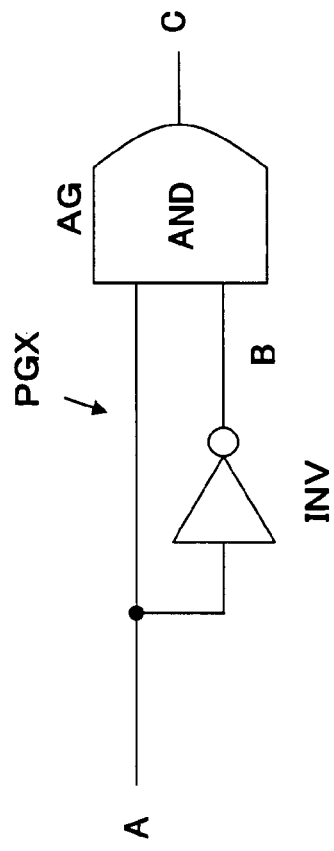
FIG. 8A is a diagram showing an example of a Φ2 and Φ3 pulse generation circuit that is utilized in the third embodiment of the present invention.
Figure 8B:
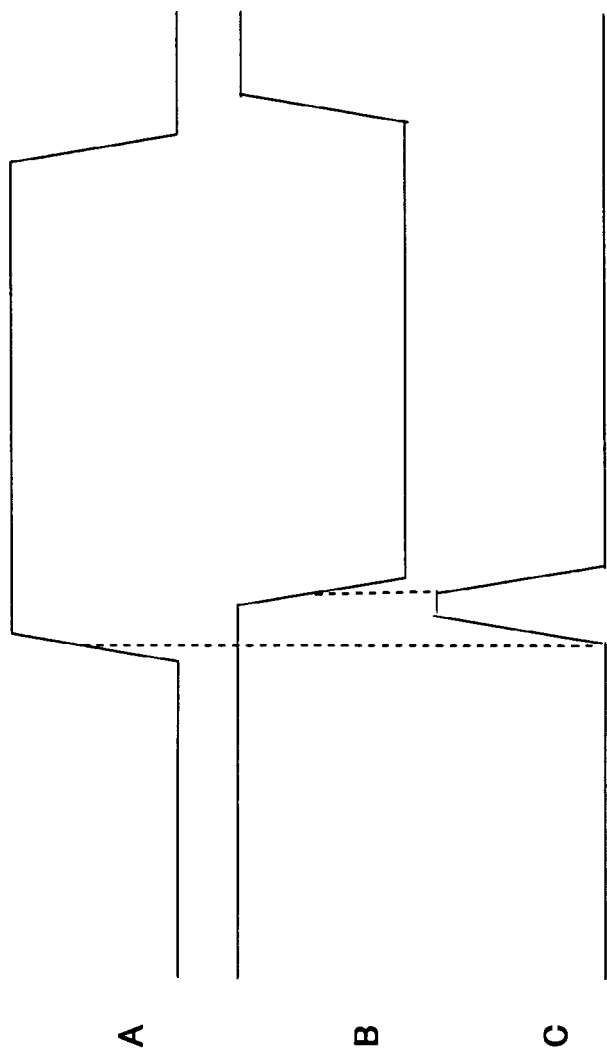
FIG. 8B is a diagram showing signal waves in the respective parts of FIG. 8A.

Pulse generation circuit PGX may have a variety of configurations, and, for example, can be implemented in the circuit configuration shown in FIG. 8A. In FIG. 8A, symbol AG indicates an AND gate, and symbol INV indicates an inverter. FIG. 8B is a diagram showing signal waves in the respective parts of FIG. 8A. Symbol A indicates the waveform of an input signal of pulse generation circuit PGX. Symbol B indicates the waveform of an output signal of inverter INV. Symbol C indicates the waveform of an output signal of pulse generation circuit PGX, that is to say, the waveform of an output signal of AND gate AG.

Figure 6:
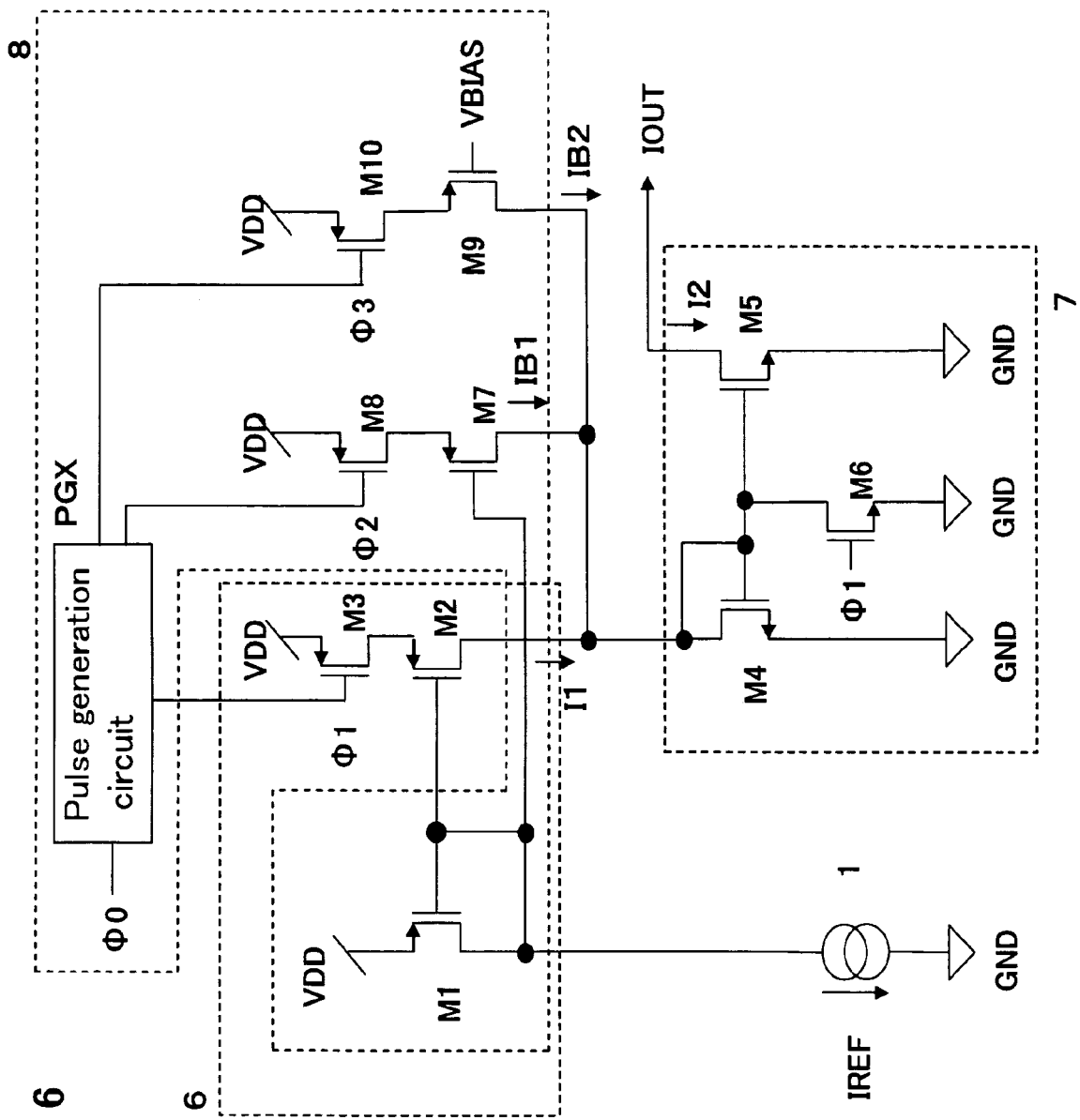
FIG. 6 is a circuit diagram showing a current drive circuit according to the third embodiment of the present invention.

FIG. 6 shows that the above described first current mirror circuit 6 of FIG. 5 is formed of PMOS transistors M1 and M2, and second current mirror circuit 7 is formed of NMOS transistors M4 and M5. In addition, MOS transistor M3 of current mirror circuit 6 is formed of a PMOS transistor, and MOS transistor M6 of current mirror circuit 7 is formed of an NMOS transistor. Furthermore, MOS transistors M7 and M8 for controlling the amount of boost current are formed of PMOS transistors, and MOS transistors M9 and M10 for converting second current mirror circuit 7 from the off state to the on state at a high speed at the time of boosting are formed of PMOS transistors. The circuit of FIG. 6 can gain the same effects as those of the circuit of FIG. 5.

Next, the operation of the circuit shown in FIG. 5 is described in reference to FIG. 7. FIG. 7 shows the operation of the circuit of FIG. 5. In FIG. 5, signal Φ0 is an input signal that switches at a high speed between the two voltage levels, the first power supply voltage GND and the second power supply voltage VDD. In addition, in the same manner, signals Φ1, Φ2 and Φ3 are output signals of pulse generation circuit PGX that switches at a high speed between the voltage levels GND and VDD. Rises in signals Φ1, Φ2 and Φ3 are approximately synchronized with each other. When signal t1 transitions from the VDD potential to the GND potential, MOS transistor M3 is turned off and MOS transistor M6 is turned on. The gate potential of MOS transistor M5 becomes of the VDD potential after high-speed charging by means of MOS transistor M6. As a result of this, MOS transistor M5 is turned off at a high speed.

Next, when signal Φ1 transitions from the GND potential to the VDD potential, MOS transistor M6 is turned off and MOS transistor M3 is turned on. At this time, second current mirror circuit 7 is driven by first current mirror circuit 6. At this point, when reference current IREF is small in comparison with the input load capacitance of second current mirror circuit 7, it takes time to discharge the input load capacitance, and the gate potential of MOS transistor M5 becomes gradual, as in waveform V1. Therefore, a high-speed rise in the second output current cannot be gained (the output current waveform becomes like that of "IOUT1").

Therefore, in the present embodiment, the line to which current source 1 has been connected is connected to the gate of NMOS transistor M7. Thus, the third current mirror circuit is formed, through which boost current IB1 that is equal to or proportional to reference current IREF flows. The third current mirror circuit uses NMOS transistor M8 to inject boost current IB1 to second current mirror circuit 7 at the time of a rise when a current is outputted by means of signal Φ2.

Furthermore, at this time, it is necessary to maintain the linearity of the output current by suppressing overshooting and undershooting of the second output current. In order to do this, the present embodiment is provided with MOS transistors M9 and M10. MOS transistors M9 and M10 inject current IB2 so that the gate voltages of MOS transistors M4 and M5 of second current mirror circuit 7 reach at a high speed the threshold voltages for converting the transistors to the on state. The gate of MOS transistor M9 is biased, in accordance with the amount of input load capacitance of second current mirror circuit 7. MOS transistor M10 is utilized as a switch. A desired amount of current is injected into second current mirror circuit 7 in accordance with the pulse width of signal Φ3. As a result of this, the gate potential of MOS transistor M5 becomes as waveform V2 of FIG. 7. Thus, the waveform of the second output current from second current mirror circuit 7 becomes as IOUT2.

Figure 9:
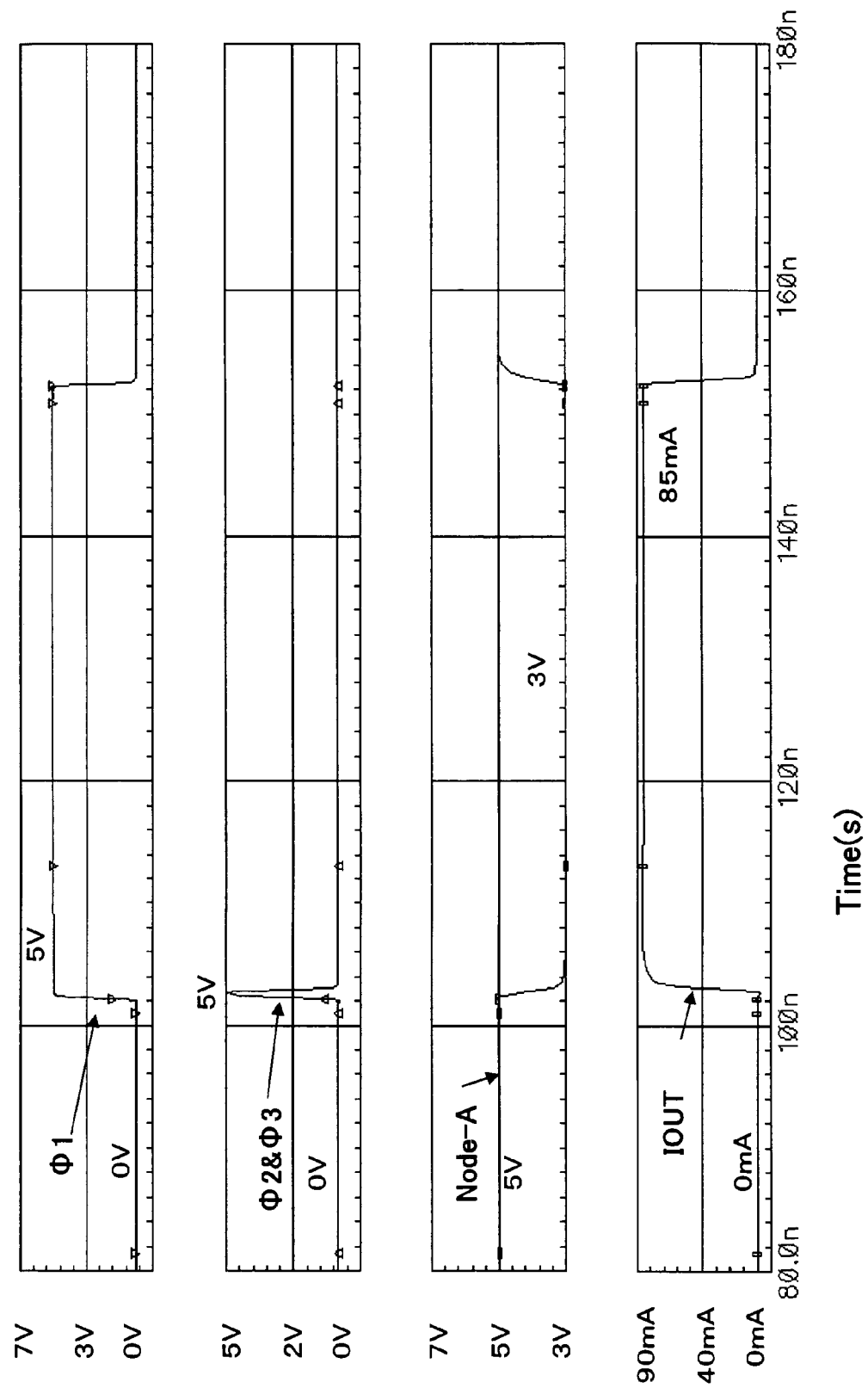
FIG. 9 is a diagram showing the simulation results of the current drive circuit according to the third embodiment of the present invention.

FIG. 9 shows the results of actual simulation of the current drive circuit that uses the circuit configuration shown in FIG. 5. This figure shows the waveforms of signals Φ1, Φ2 and Φ3, the signal waveform of Node-A, and the waveform of output current IOUT, respectively.

Figure 10:
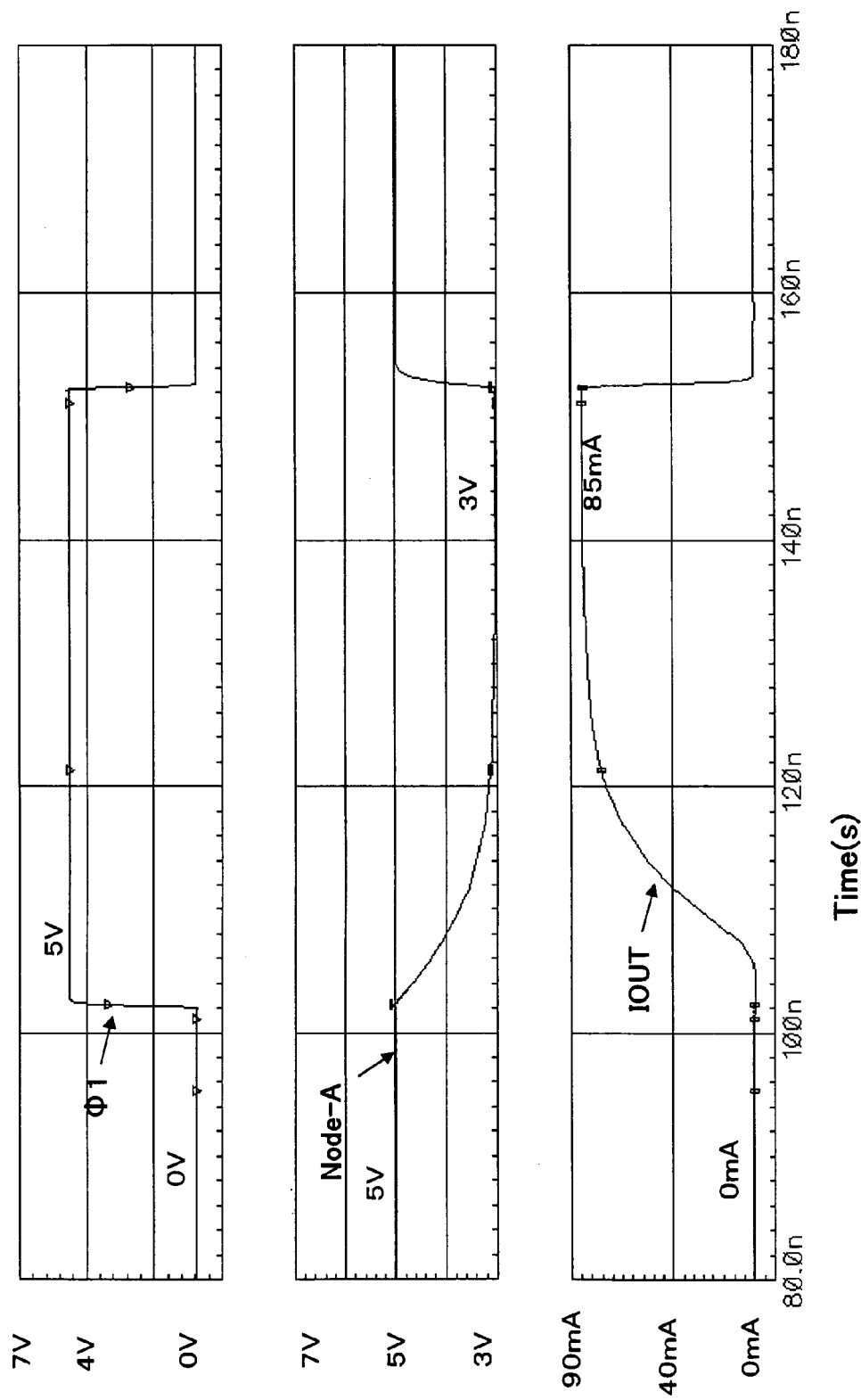
FIG. 10 is a diagram showing the simulation results of the current drive circuit in the case where there is no output current control circuit, according to the third embodiment of the present invention.
Figure 11:
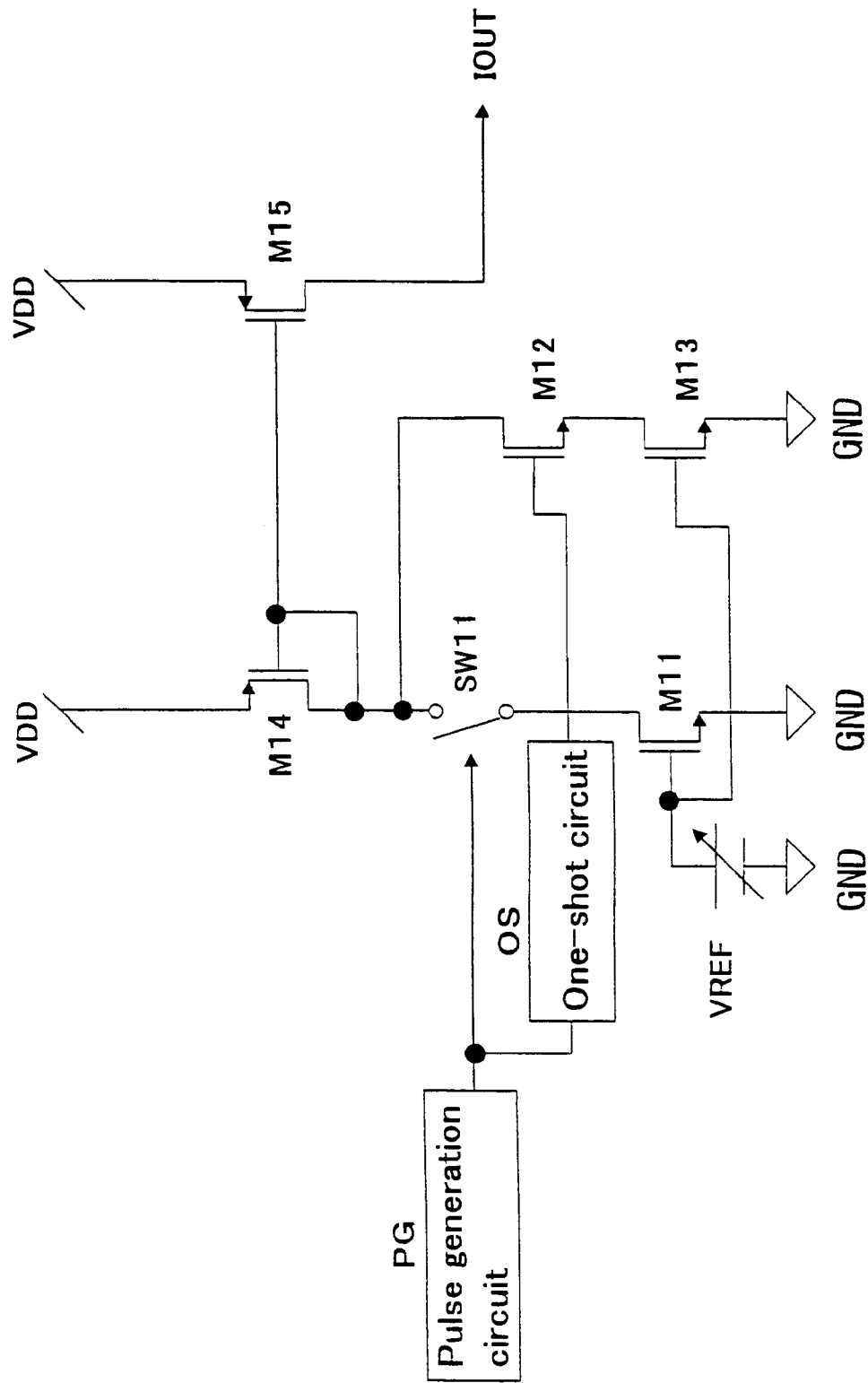
FIG. 11 is a circuit diagram showing the configuration according to the first prior art.
Figure 12:
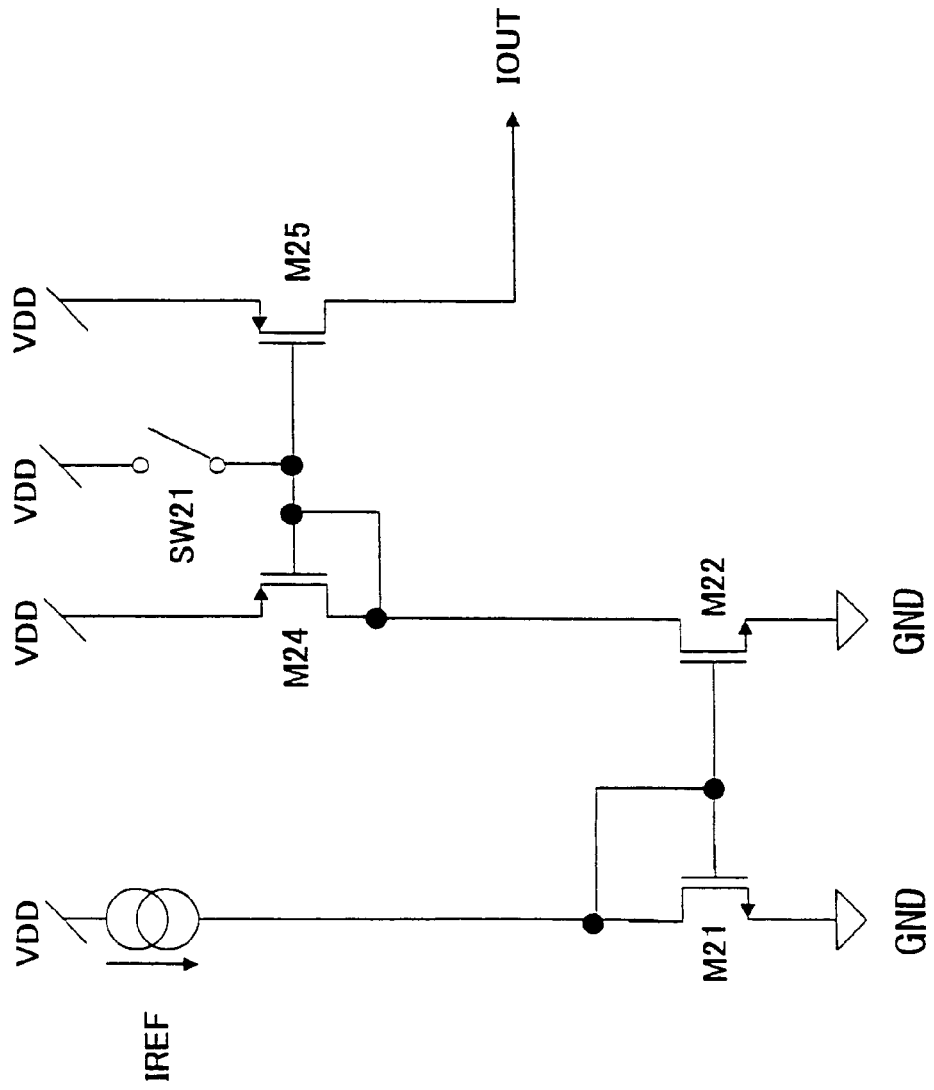
FIG. 12 is a circuit diagram showing the configuration according to the second prior art.

FIG. 10 shows the results of the simulation in the case where there is no output current control circuit 2 in the circuit of FIG. 5. FIG. 10 shows the waveform of signal Φ1, the signal waveform of Node-A, and the waveform of output current IOUT, respectively.

It can be understood from the comparison of FIGS. 9 and 10 that the rise in output current IOUT becomes steep by providing output current control circuit 2.

Here, in the above described configuration, it can be said that it is a light emitting element drive circuit that supplies the output current of current output circuit 3 to the light emitting element.

In addition, current source 1 generates and outputs an analog current having a value that corresponds to the weight of a bit of two-value digital data in the configuration, and thereby, a digital-analog converter can be formed by using the current drive circuit.

INDUSTRIAL APPLICABILITY

The present invention provides a current drive circuit or the like which has the working effect of achieving high-speed rise and fall while maintaining the linearity of the output current, and thus is extremely useful.

What is claimed is:

1. A current drive circuit comprising:
a current source that produces a varying source current;
an output current control circuit that temporarily supplies a boost current having a value corresponding to that of the source current;
a current output circuit that amplifies the source and boost currents in accordance with an external signal, the current output circuit comprising:
  a first current mirror circuit that amplifies the source current to produce a first amplified current, and
  a second current mirror circuit that amplifies the first amplified current and the boost current to produce a drive circuit output current;
a first switching element that has switch poles respectively connected to a current output part of the first current mirror circuit and a first power supply voltage; and
a second switching element that has switch poles respectively connected to a current input part of the second current mirror circuit and a second power supply voltage, wherein:
the first and second switching elements switch and operate in opposite phases in accordance with the external signal,
the first switching element raises an output current of the first current mirror circuit when turned on,
the second switching raises an output current of the second current mirror circuit when turned off, and
the output current control circuit temporarily supplies the boost current at a time of rise in the drive circuit output current so as to increase the rate of rise in the drive circuit output current.

2. A current drive circuit comprising:
a current source that produces a varying source current;
an output current control circuit that temporarily supplies a boost current having a value corresponding to that of the source current;
a current output circuit that amplifies the source and boost currents in accordance with an external signal, the current output circuit comprising:
  a first current mirror circuit that amplifies the source current to produce a first amplified current, and
  a second current mirror circuit that amplifies the first amplified current and the boost current to produce a drive circuit output current; and
a pulse generation circuit that generates first and second signals from the external signal, the second signal rises in synchronization with the first signal and falls before the first signal, wherein:
the first and second current mirror circuits operate at a time of rise in the first signal,
the output current control circuit comprises a third current mirror circuit that operates at a time of rise in the second signal and has a current input part and a current output part respectively connected to the current source and a point of connection between the first and second current mirror circuits and
the output current control circuit temporarily supplies the boost current at a time of rise in the drive circuit output current so as to increase the rate of rise in the drive circuit output current.

3. The current drive circuit of claim 2, further comprising:
a current injection element having two ends respectively connected to the point of connection between the first and second current mirror circuits and a power supply voltage, wherein:
the pulse generation circuit further generates a third signal from the external signal,
the third signal rises in synchronization with the first signal and falls before the first signal, and
the current injection element injects a current into the second current mirror circuit at a time of rise in the third signal.

4. The current drive circuit of claim 3, further comprising:
a first switching element that has switch poles respectively connected to a current output part of the first current mirror circuit and a first power supply voltage;
a second switching element that has switch poles respectively connected to a current input part of the second current mirror circuit and a second power supply voltage;
a third switching element that has switch poles respectively connected to the current output part of the third current mirror circuit and the first power supply voltage; and
a fourth switching element that has switch poles respectively connected to the current injection element and either of the first and second power supply voltages, wherein:
the first and second switching elements switch and operate in opposite phases in accordance with the first signal,
the third switching element switches and operates in accordance with the second signal,
the fourth switching element switches and operates in accordance with the third signal,
the first switching element raises an output current of the first current mirror circuit when turned on,
the second switching element raises an output current of the second current mirror circuit when turned off,
the third switching element raises an output current of the third current mirror circuit when turned on, and
the fourth switching element raises an output current of the current injection element.

5. A light emitting element drive circuit, comprising:
a current source that produces a varying source current;
an output current control circuit that temporarily supplies a boost current having a value corresponding to that of the source current;
a current output circuit that amplifies the source and boost currents in accordance with an external signal for supplying the amplified current to a light emitting element, the current output circuit comprising:
  a first current mirror circuit that amplifies the source current to produce a first amplified current, and
  a second current mirror circuit that amplifies the first amplified current and the boost current to produce a drive circuit output current;
a first switching element that has switch poles respectively connected to a current output part of the first current mirror circuit and a first power supply voltage; and
a second switching element that has switch poles respectively connected to a current input part of the second current mirror circuit and a second power supply voltage, wherein:
the first and second switching elements switch and operate in opposite phases in accordance with the external signal,
the first switching element raises an output current of the first current mirror circuit when turned on,
the second switching raises an output current of the second current mirror circuit when turned off, and the output current control circuit temporarily supplies the boost current at a time of rise in the drive circuit output current so as to increase the rate of rise in the drive circuit output current.

6. A light emitting element drive circuit comprising:
a current source that produces a varying source current;
an output current control circuit that temporarily supplies a boost current having a value corresponding to that of the source current;
a current output circuit that amplifies the source and boost currents in accordance with an external signal, the current output circuit comprising:
  a first current mirror circuit that amplifies the source current to produce a first amplified current, and
  a second current mirror circuit that amplifies the first amplified current and the boost current to produce a drive circuit output current; and
a pulse generation circuit that generates first and second signals from the external signal, the second signal rises in synchronization with the first signal and falls before the first signal, wherein:
the first and second current mirror circuits operate at a time of rise in the first signal,
the output current control circuit comprises a third current mirror circuit that operates at a time of rise in the second signal and has a current input part and a current output part respectively connected to the current source and a point of connection between the first and second current mirror circuits, and
the output current control circuit temporarily supplies the boost current at a time of rise in the drive circuit output current so as to increase the rate of rise in the drive circuit output current.

7. The light emitting element drive circuit of claim 6, further comprising:
a current injection element having two ends respectively connected to the point of connection between the first and second current mirror circuits and a power supply voltage, wherein:
the pulse generation circuit further generates a third signal from the external signal,
the third signal rises in synchronization with the first signal and falls before the first signal, and
the current injection element injects a current into the second current mirror circuit at a time of rise in the third signal.

8. The light emitting element drive circuit of claim 7, further comprising:
a first switching element that has switch poles respectively connected to a current output part of the first current mirror circuit and a first .power supply voltage;
a second switching element that has switch poles respectively connected to a current input part of the second current mirror circuit and a second power supply voltage;
a third switching element that has switch poles respectively connected to the current output part of the third current mirror circuit and the first power supply voltage; and
a fourth switching element that has switch poles respectively connected to the current injection element and either of the first and second power supply voltages, wherein:
the first and second switching elements switch and operate in opposite phases in accordance with the first signal,
the third switching element switches and operates in accordance with the second signal,
the fourth switching element switches and operates in accordance with the third signal,
the first switching element raises an output current of the first current mirror circuit when turned on,
the second switching element raises an output current of the second current mirror circuit when turned off,
the third switching element raises an output current of the third current mirror circuit when turned on, and
the fourth switching element raises an output current of the current injection element.

9. A digital-analog converter comprising:
a current source that produces an analog source current corresponding to the bit weight of a two-value digital value;
an output current control circuit that temporarily supplies a boost current having a value corresponding to that of the source current;
a current output circuit that amplifies the source and boost currents in accordance with an external signal, the current output circuit comprising:
  a first current mirror circuit that amplifies the source current to produce a first amplified current, and
  a second current mirror circuit that amplifies the first amplified current and the boost current to produce a drive circuit output current;
a first switching element that has switch poles respectively connected to a current output part of the first current mirror circuit and a first power supply voltage; and
a second switching element that has switch poles respectively connected to a current input part of the second current mirror circuit and a second power supply voltage, wherein:
the first and second switching elements switch and operate in opposite phases in accordance with the external signal,
the first switching element raises an output current of the first current mirror circuit when turned on,
the second switching raises an output current of the second current mirror circuit when turned off, and
the output current control circuit temporarily supplies the boost current at a time of rise in the drive circuit output current so as to increase the rate of rise in the drive circuit output current.

10. A digital-analog converter comprising:
a current source that produces a varying source current;
an output current control circuit that temporarily supplies a boost current having a value corresponding to that of the source current;
a current output circuit that amplifies the source and boost currents in accordance with an external signal, the current output circuit comprising:
  a first current mirror circuit that amplifies the source current to produce a first amplified current, and
  a second current mirror circuit that amplifies the first amplified current and the boost current to produce a drive circuit output current; and
a pulse generation circuit that generates first and second signals from the external signal, the second signal rises in synchronization with the first signal and falls before the first signal, wherein:

the first and second current mirror circuits operate at a time of rise in the first signal, the output current control circuit comprises a third current mirror circuit that operates at a time of rise in the second signal and has a current input part and a current output part respectively connected to the current source and a point of connection between the first and second current mirror circuits, and the output current control circuit temporarily supplies the boost current at a time of rise in the drive circuit output current so as to increase the rate of rise in the drive circuit output current.

11. The digital-analog converter of claim 10, further comprising:

a current injection element having two ends respectively connected to the point of connection between the first and second current mirror circuits and a power supply voltage, wherein:

the pulse generation circuit further generates a third signal from the external signal, the third signal rises in synchronization with the first signal and falls before the first signal, and the current injection element injects a current into the second current mirror circuit at a time of rise in the third signal.

12. The digital-analog converter of claim 11, further comprising:

a first switching element that has switch poles respectively connected to a current output part of the first current mirror circuit and a first power supply voltage;

a second switching element that has switch poles respectively connected to a current input part of the second current mirror circuit and a second power supply voltage;

a third switching element that has switch poles respectively connected to the current output part of the third current mirror circuit and the first power supply voltage; and a fourth switching element that has switch poles respectively-connected to the current injection element and either of the first and second power supply voltages, wherein:

the first and second switching elements switch and operate in opposite phases in accordance with the first signal, the third switching element switches and operates in accordance with the second signal, the fourth switching element switches and operates in accordance with the third signal, the first switching element raises an output current of the first current mirror circuit when turned on, the second switching element raises an output current of the second current mirror circuit when turned off, the third switching element raises an output current of the third current mirror circuit when turned on, and the fourth switching element raises an output current of the current injection element.

* * * * *